(12) United States Patent  (10) Patent No.: US 7,417,287 B2
Huang et al.  (45) Date of Patent: Aug. 26, 2008

(54) ELECTROSTATIC DISCHARGE DEVICE HAVING CONTROLLABLE TRIGGER VOLTAGE

(75) Inventors: Chih-Feng Huang, Jhubei (TW);
 Ta-yung Yang, Milpitas, CA (US);
 Jenn-yu G. Lin, Taipei (TW); Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 11/174,018

(22) Filed: Jul. 1, 2005

(65) Prior Publication Data

US 2007/0001229 A1 Jan. 4, 2007

(51) Int. Cl.
 *H01L 27/01* (2006.01)
 *H01L 31/0392* (2006.01)

(52) U.S. Cl. .................................. 257/355; 257/356
(58) Field of Classification Search .......... 257/355–356, 257/361–362
 See application file for complete search history.

(56) References Cited

U.S. PATENT DOCUMENTS 5,548,134 A * 8/1996 Tailliet ..................... 257/173

* cited by examiner

*Primary Examiner*—Theresa T Doan
(74) *Attorney, Agent, or Firm*—J.C. Patents

(57) ABSTRACT

An electrostatic discharge (ESD) device has a parasitic SCR structure and a controllable trigger voltage. The controllable trigger voltage of the ESD device is achieved by modulating a distance between an edge of a lightly doped well and an edge of a heavily doped region located at two ends of the lightly doped well. Since the distance and the trigger voltage are linearly proportional, the trigger voltage can be set to a specific value from a minimum value to a maximum value.

6 Claims, 4 Drawing Sheets

ELECTROSTATIC DISCHARGE DEVICE HAVING CONTROLLABLE TRIGGER VOLTAGE

BACKGROUND OF THE INVENTION

1. Field of the Invention

The present invention relates generally to an electrostatic discharge (ESD) device. More particularly, the present invention relates to an ESD device with a parasitic SCR structure having a controllable trigger voltage.

2. Description of Related Art

ESD devices have been widely used in integrated circuits to prevent damages caused by static electricity. Generally, the ESD device occupies a considerable chip area on which an integrated circuit (IC) is fabricated, which accordingly increases manufacturing cost. Furthermore, due to the transmission characteristic of conducting wires and generally a large dimension of the ESD device, current flowing through the ESD device is not uniform, which may affect the electric characteristics, such as a breakdown voltage of the ESD device.

The ESD devices with parasitic SCR structure are applied in many applications. How to achieve a stable and controllable trigger voltage of the parasitic SCR is still a main issue in the industry field.

Therefore, the ESD device having a controllable trigger voltage and improved electric characteristics is desired.

SUMMARY OF THE INVENTION

According to one aspect of the invention, an ESD device having a parasitic SCR structure includes a P-type substrate, an N-type well, a first N+-type region, a first P+-type region, a second N+-type region, a second P+-type region, a third N+-type region, a first electrode and a second electrode. Moreover, the N-type well is formed inside the P-type substrate, and the first N+-type region and the first P+-type region are formed inside the P-type substrate and outside the N-type well. The first P+-type region is isolated from the first N+-type region by a first field oxide. The third N+-type region is formed between the second P+-type region and a second field oxide. Furthermore, a junction between the second field oxide and the third N+-type region is spaced from the edge of the N-type well by a predetermined distance. Moreover, the first electrode is electrically connected to the first P+-type region and the first N+-type region through a first conductor. Besides, the second electrode is electrically connected to the second P+-type region and the second N+-type region through a second conductor. Adjusting the predetermined distance controls a trigger voltage of the ESD device.

According to another aspect of the present invention, an ESD device having a parasitic SCR structure includes a P-type substrate, an N-type buried layer, an N-type well, a P-type well, a fourth N+-type region, a fourth P+-type region, a fifth N+-type region, a fifth P+-type region, a sixth P+-type region, a third electrode and a fourth electrode. Moreover, the N-type buried layer is formed inside the P-type substrate and the N-type well is formed on the N-type buried layer. The P-type well is formed on the N-type buried layer next to the N-type well. The fourth N+-type region and the fourth P+-type region are formed inside the N-type well. In addition, the fourth P+-type region is isolated from the fourth N+-type region by a third field oxide. The fifth N+-type region and the fifth P+-type region are formed inside the P-type well. Moreover, the sixth P+-type region is formed between the fifth N+-type region and a fourth field oxide, wherein a junction between the fourth field oxide and the sixth P+-type region is spaced from the edge of the P-type well by a predetermined distance. Furthermore, the third electrode is electrically connected to the fourth P+-type region and the fourth N+-type region through a third conductor. Besides, the fourth electrode is electrically connected to the fifth P+-type region and the fifth N+-type region through a fourth conductor. Adjusting the predetermined distance can allow the edge of the P-type well to be located in a range between the fourth field oxide and the sixth P+-type region, which determines a trigger voltage of the ESD device.

According to another aspect of the invention, since an ESD device implemented by the present invention has a parasitic SCR structure having controllable trigger voltage, the controllable trigger voltage can be adjusted by modulating a predetermined distance between a lightly doped well and heavily doped region. Therefore, the trigger voltage can be determined without changing IC manufacturing processes.

The objectives, other features and advantages of the invention will become more apparent and easily understood from the following detailed description of the invention when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention, and, together with the description, serve to explain the principles of the invention.

DETAILED DESCRIPTION OF THE INVENTION

Reference will now be made in detail to exemplary implementations, which are illustrated in the accompanying drawings. Wherever possible, the same reference numbers will be used throughout the drawings to be referred to the same parts.

The following examples and implementations overcome disadvantages of traditional ESD devices and can reduce an occupied chip area and IC-manufacturing cost. According to one embodiment of the present invention, an ESD device is formed with a plurality of N+-type regions and a plurality of P+-type regions located inside an N-type well. The P+-type regions and N+-type regions are interleaved next to each other to form a sequence. Two terminals of this sequence are the N+-type regions. A trigger voltage of the ESD device can be controlled by adjusting the location of an edge of the N-type well relative to the aforementioned N+-type regions.

Moreover, the ESD device is formed under a pad and connected with the pad by metal. Since the pad is an ideal conductor, the current flowing from the pad to the ESD device can be well distributed, which improves the performance of the ESD device. The ESD device is formed under the pad, which also saves occupied chip area of integrated circuits. Accordingly, the manufacturing cost is reduced.

Figure 1:
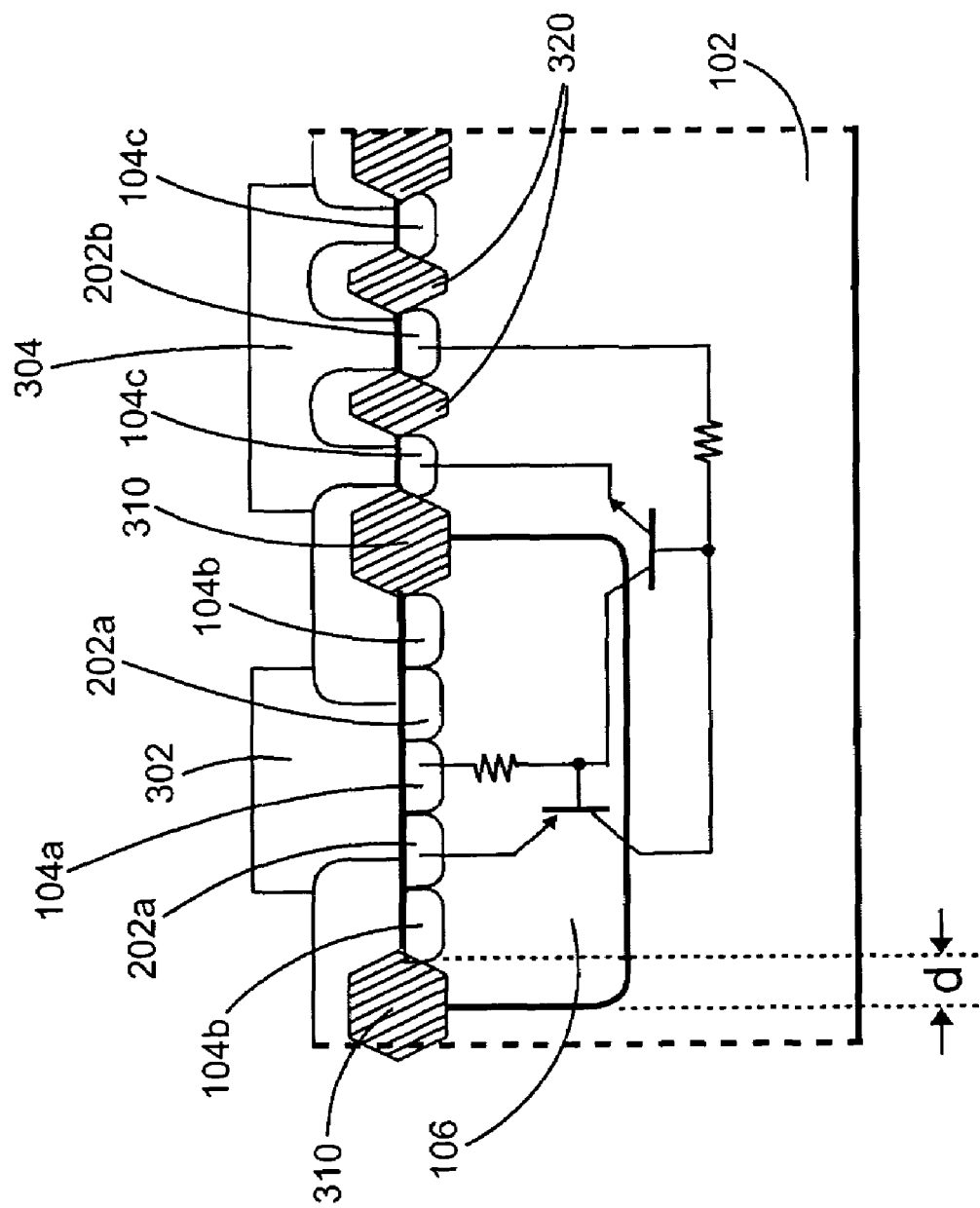
FIG. 1 shows a side view of an ESD device with a parasitic SCR structure according to an embodiment of the present invention.

FIG. 1 illustrates a side view of an ESD device 100 having a controllable trigger voltage $V_{TG}$ according to an embodiment of the present invention. Referring to FIG. 1, the ESD device 100 formed inside a P-type substrate 102, comprises an N-type well 106; a first N+-type region 104c and a first P+-type region 202b that are isolated to each other by a first field oxide 320; a second N+-type region 104a; a second P+-type region 202a and a third N+-type region 104b. In addition, the second P+-type region 202a, the N-type well 106 and the P-type substrate 102, form an equivalent transistor, while the N-type well 106, the P-type substrate 102 and the first N+-type region 104c, form another equivalent transistor. A second field oxide 310 separates the third N+-type region 104b from the first N+-type region 104c. Moreover, a first electrode is electrically connected to the first P+-type region 202b and the first N+-type region 104c through a first conductor 304. Besides, a second electrode is electrically connected to the second P+-type region 202a and the second N+-type region 104a through a second conductor 302. Material of the first conductor 304 and the second conductor 302 can be metal. In this embodiment, the second electrode is electrically connected to the pad and the first electrode is electrically connected to a power source terminal or to a ground reference terminal. Obviously, one skilled in the art can modify the preceding connection of the first and the second electrode; that is, the first electrode being electrically connected to the pad and the second electrode being electrically connected to a power source terminal or to the ground reference terminal.

The connected complementary doped regions, such as the second N+-type region 104a and the second P+-type regions 202a, perform unequal voltage level when the ESD device 100 is triggered by electrostatic phenomenon. As shown in FIG. 1, two equivalent transistors and two internal resistors form an equivalent SCR. When electrostatic voltage becomes large, the transient current flowing through the ESD device 100 induces a voltage difference between the connected complementary doped regions 104a-202a and between 104c-202b by internal resistors. Therefore, the equivalent SCR is presented as the connection of two equivalent transistors as illustrated in FIG. 1. The complementary doped regions mean different type doped regions, such as N-type doped region and P-type doped regions.

The relative location of the edge of the N-type well 106, and an edge of the third N+-type region 104b located at two ends of the aforementioned sequence, can be adjusted to modulate the trigger voltage $V_{TG}$ of the ESD device 100. The relative location is denoted as an adjustable distance d.

Furthermore, the ESD device 100 is formed under a pad (not shown), which makes use of the space under the pad, and thus saves the occupied chip area and practical manufacturing cost of integrated circuits.

Figure 2A:
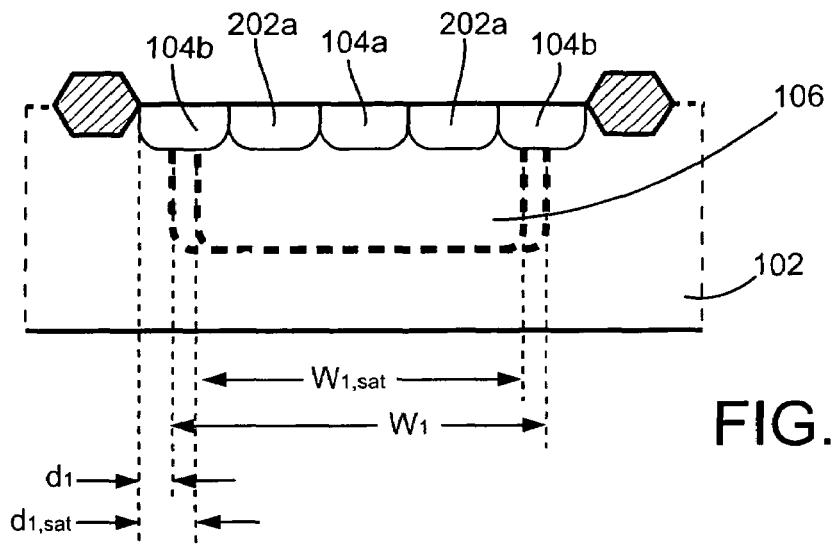
FIG. 2A-2C show a partial side view illustrating a location of the edge of an N-type well relative to the edge of an N+-type region according to the present invention.

FIG. 2A shows a partial side view illustrating the relative location of the edge of the N-type well 106 and the edge of the third N+-type region 104b when the N-type well 106 partially encloses the third N+-type region 104b. As the width of the N-type well 106 is $W_1$, an adjustable distance $d_1$ is formed between the edge of the third N+-type region 104b and the edge of the N-type well 106. The trigger voltage $V_{TG}$ is inversely proportional to the adjustable distance $d_1$. However, as shown in a point A in FIG. 3, the trigger voltage $V_{TG}$ reaches a saturated voltage $V_{TG,min}$ as the adjustable distance $d_1$ reaches a saturated value $d_{1,sat}$.

Figure 2B:
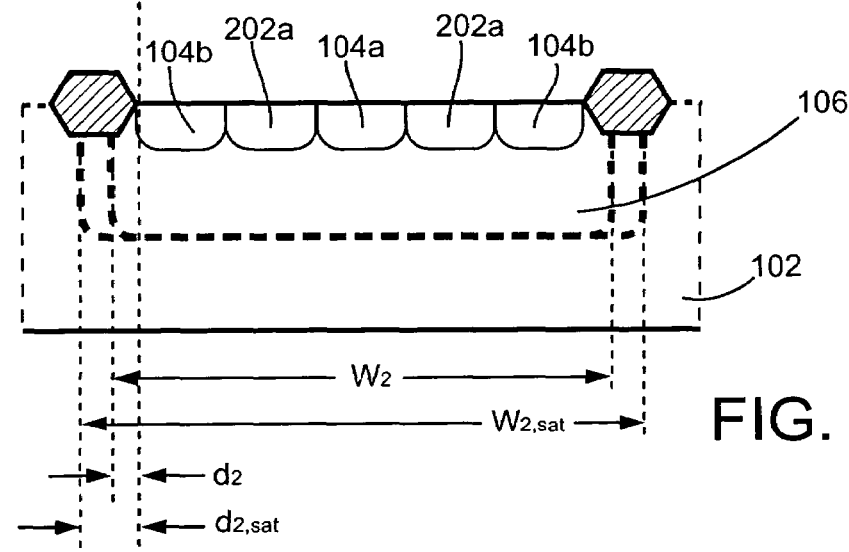

FIG. 2B shows a partial side view illustrating the relative location of the edge of the N-type well 106 and the edge of the third N+-type region 104b when the N-type well 106 completely encloses the third N+-type region 104b. As the width of the N-type well 106 is $W_2$, an adjustable distance $d_2$ will be formed between the edge of the third N+-type region 104b and the edge of the N-type well 106. The trigger voltage $V_{TG}$ is directly proportional to the adjustable distance $d_2$. However, as shown in a point C in FIG. 3, the trigger voltage $V_{TG}$ reaches a saturated voltage $V_{TG,max}$ as the adjustable distance $d_2$ reaches a saturated value $d_{2,sat}$.

Figure 2C:
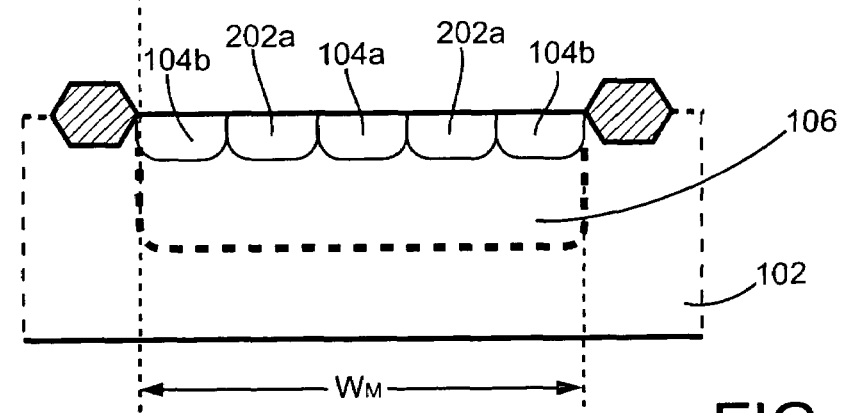

FIG. 2C shows a partial side view illustrating the relative location of the edge of the N-type well 106 and the edge of the third N+-type region 104b when the width of the N-type well 106 just equals to a width of the aforementioned sequence. That is, the edge of the N-type well 106 and the edge of the third N+-type region 104b are well aligned. A point B in FIG. 3 shows that the adjustable distances $d_1$ and $d_2$ are both zero and their corresponding trigger voltage is $V_{TG0}$.

Figure 3:
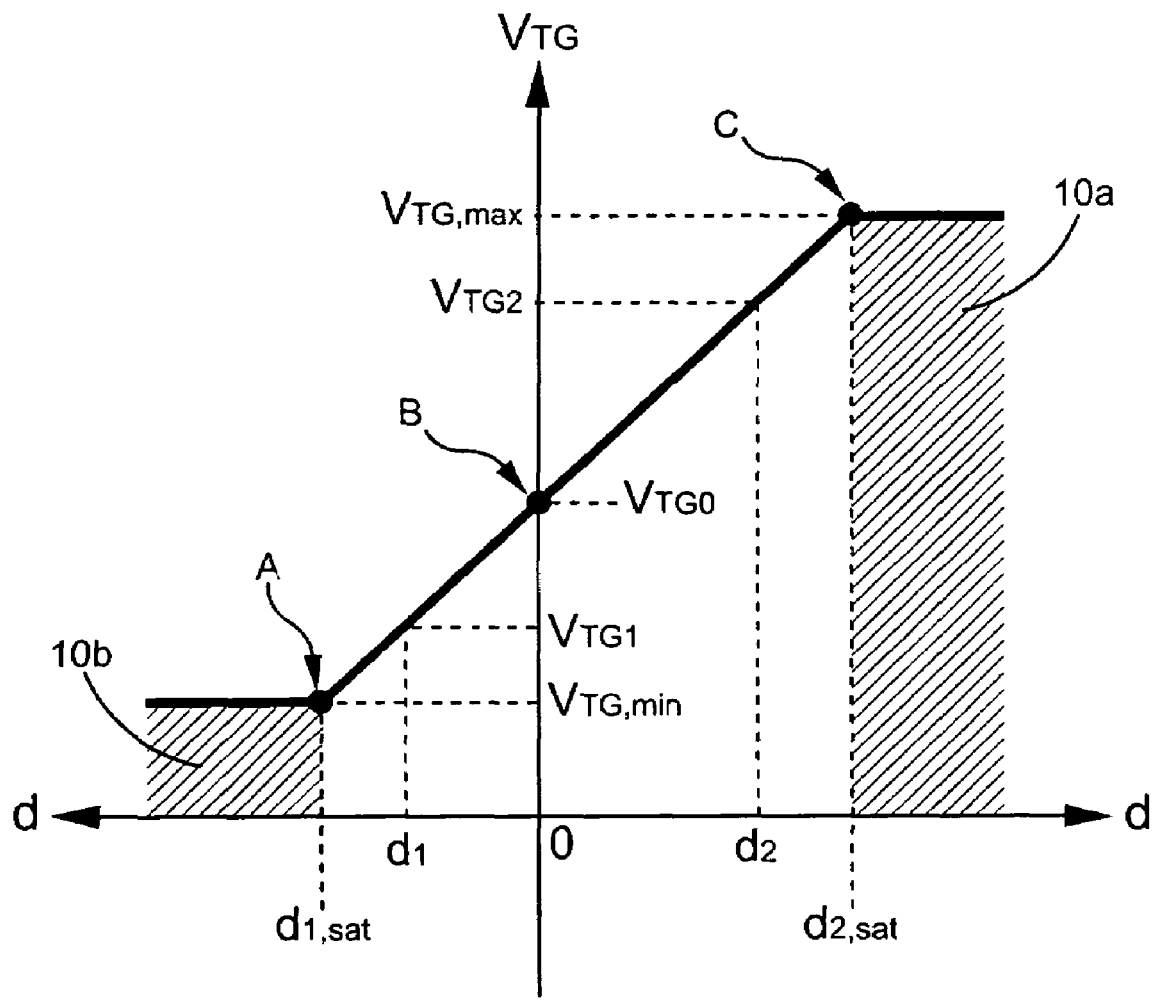
FIG. 3 shows a curve diagram showing a trigger voltage versus a predetermined distance between the edge of the N-type well and the edge of the N+-type region as the N-type well partially encloses or completely encloses the N+-type regions according to the present invention.

Further referring to FIG. 3, a curve diagram showing the trigger voltage $V_{TG}$ versus the adjustable distance d is illustrated. The horizontal axis shown in FIG. 3 representing the adjustable distance d is bi-directional. The trigger voltage $V_{TG}$ decreases in response to an increment of the adjustable distance $d_1$ and reaches downward a minimum saturated trigger voltage $V_{TG,min}$ at a minimum adjustable distance $d_{1,sat}$ (point A). The trigger voltage $V_{TG}$ increases in response to an increment of the adjustable distance $d_2$ and reaches upward a maximum saturated trigger voltage $V_{TG,max}$ at a maximum adjustable distance $d_{2,sat}$ (point C). Therefore, the variation of the trigger voltage $V_{TG}$ (from the point A to the point C) and the variation of the adjustable distance d are linearly proportional. By modulating the adjustable distance d between the minimum adjustable distance $d_{1,sat}$ and the maximum adjustable distance $d_{2,sat}$, the trigger voltage $V_{TG}$ can be set in any specific value under same process condition. Saturation regions 10a and 10b shown in FIG. 3 mean that the trigger voltage $V_{TG}$ does not vary in response to an increment of the adjustable distance d.

Figure 4:
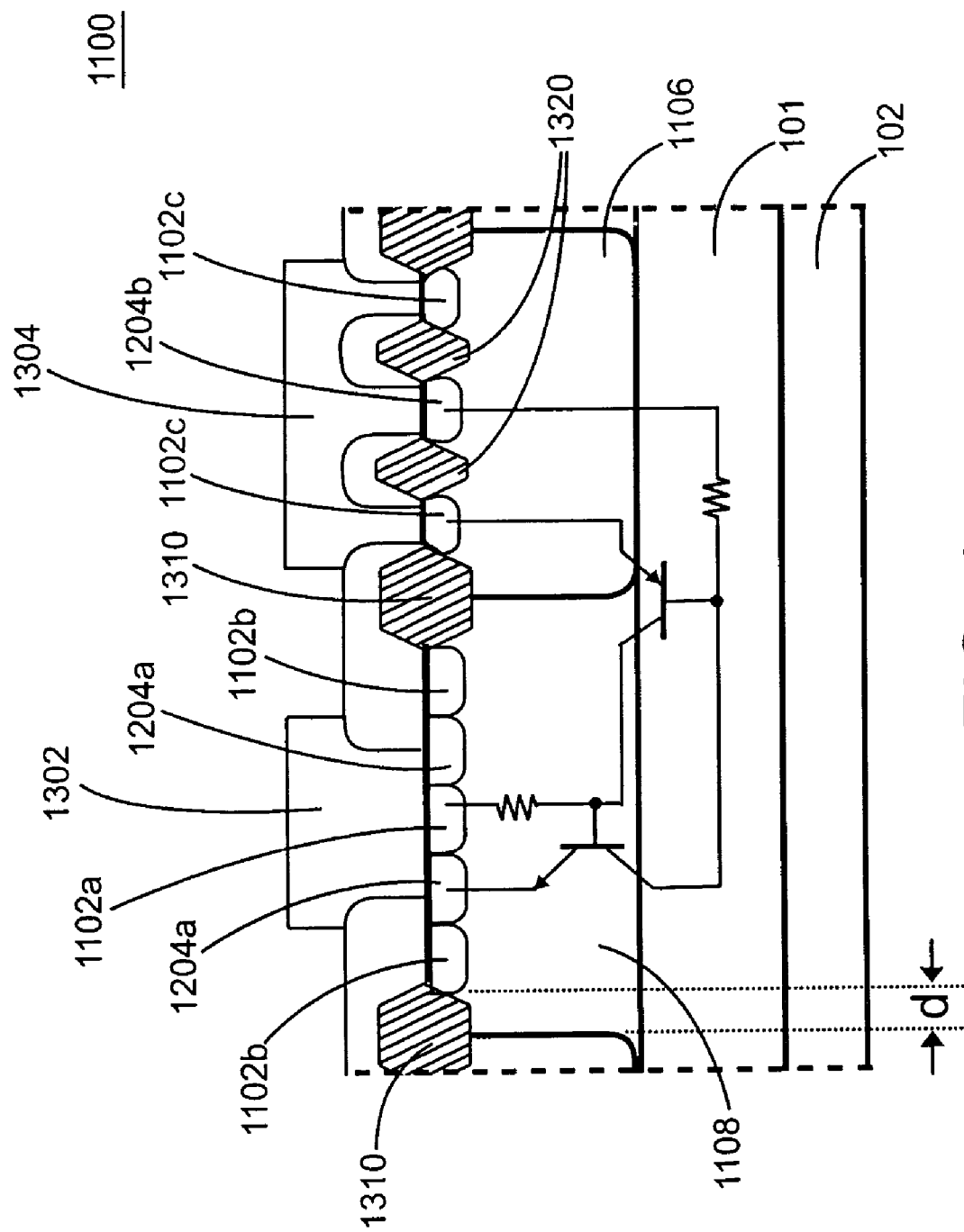
FIG. 4 shows a side view of the ESD device according to another embodiment of the present invention.

FIG. 4 illustrates a side view of an ESD device 1100 having a controllable trigger voltage according to another embodiment of the present invention. The ESD device 1100 is a complementary structure of the ESD device 100, which represents that the ESD device with controllable trigger voltage according to the present invention can be also formed in a complementary process.

In the ESD device 1100, there is an N-type buried layer 101 formed in a P-type substrate 102, an N-type well 1106 formed on the N buried layer 101, and a P well 1108. The P well 1108 can be formed by P-type ions doping or simply by geometrically surrounding the P-type substrate 102 with the N-type buried layer 101 and the N-type wells 106. The ESD device 1100 represents complementary polarity of the ESD device 100 as illustrated in FIG. 1. Also, the equivalent transistors illustrated in FIG. 4 also have complementary polarity of the equivalent transistors as illustrated in FIG. 1, wherein a fourth P+-type region 1102c, the N-type well 1106, the P well 1108 and a fifth N+-type region 1204a, form an equivalent SCR. In addition, a third electrode is electrically connected to the fourth P+-type region 1102c and the fourth N+-type region 1204b through a third conductor 1304. Besides, a fourth electrode is electrically connected to the fifth P+-type region 1102a and the fifth N+-type region 1204a through a fourth conductor 1302. A fourth field oxide 1310 is used to separate the sixth P+-type region 1102b from the fourth P+-type region 1102c.

The ESD device 1100 is able to adjust the trigger voltage $V_{TG}$ by adjusting the location of the edge of P-type well 1108 relative to the edge of the two terminals of the aforementioned sequence (in this embodiment, they are the sixth P+-type region 1102b).

While an embodiment of the present invention is illustrated and described, various modification and improvement can be made by those skilled in the art. The embodiment of the present invention is therefore described in an illustrative but not restrictive sense. It is intended that the present invention may not be limited to the particular forms as illustrated, and that all the modifications maintaining the spirit and realm of the present invention are within the scope as defined in the appended claims.

What is claimed is:

1. An electrostatic discharge device having a controllable trigger voltage, said electrostatic discharge device comprising:
   a P-type substrate;
   an N-type well, formed inside said P-type substrate;
   a first N+-type region, formed inside said P-type substrate and outside said N-type well;
   a first P+-type region, formed inside said P-type substrate and outside said N-type well, wherein said first P+-type region is isolated from said first N+-type region by a first field oxide;
   a second N+-type region, formed inside said N-type well;
   a second P+-type region, formed inside said N-type well;
   a third N+-type region, formed between said second P+-type region and a second field oxide, wherein said second N+-tyne region is next to said second P+-tvpe region and said second P+-type region is next to said third N+-tvpe region. said third N+-type region is isolated from any conductor and is isolated from said first N+-type region by said second field oxide, and a junction between said second field oxide and said third N+-type region is spaced from an edge of said N-type well by a predetermined distance;
   a first electrode, electrically connected to said first P+-type region and said first N+-type region through a first conductor; and
   a second electrode, electrically connected to said second P+-type region and said second N+-type region through a second conductor; wherein said controllable trigger voltage is determined by adjusting said predetermined distance which allows said edge of said N-type well to be located in a range between said second field oxide and said third N+-type region.

2. The electrostatic discharge device as claimed in claim 1, wherein said first conductor and said second conductor are metal.

3. The electrostatic discharge device as claimed in claim 1, wherein when said N-type well completely encloses said third N+-type region, said trigger voltage of said electrostatic discharge device varies directly proportional to said predetermined distance; whereas said N-type well partially encloses said third N+-type region, said trigger voltage of said electrostatic discharge device varies inversely proportional to said predetermined distance.

4. The electrostatic discharge device as claimed in claim 3, wherein said predetermined distance is modulated by arranging a relative location of said N-type well to an edge of said third N+-type region so as to linearly adjust said trigger voltage of said electrostatic discharge device.

5. The electrostatic discharge device as claimed in claim 4, wherein one of said first and second electrode is electrically connected to a pad, while another is electrically connected to a power-source terminal or a ground reference terminal.

6. The electrostatic discharge device as claimed in claim 1, wherein one of said first and second electrodes is electrically connected to a pad, while another is electrically connected to a power-source terminal or a ground reference terminal.

* * * * *